United States Patent
Hshieh et al.

(10) Patent No.: US 6,620,691 B2
(45) Date of Patent: Sep. 16, 2003

(54) SEMICONDUCTOR TRENCH DEVICE WITH ENHANCED GATE OXIDE INTEGRITY STRUCTURE

(75) Inventors: Fwu-Iuan Hshieh, Saratoga, CA (US); Koon Chong So, Fremont, CA (US); Yan Man Tsui, Union City, CA (US)

(73) Assignee: General Semiconductor, Inc., Melville, NY (US)

( * ) Notice: Subject to any disclaimer, the term of this patent is extended or adjusted under 35 U.S.C. 154(b) by 0 days.

(21) Appl. No.: 10/042,558

(22) Filed: Nov. 20, 2001

(65) Prior Publication Data

US 2002/0061623 A1 May 23, 2002

Related U.S. Application Data

(62) Division of application No. 09/595,120, filed on Jun. 16, 2000.

(51) Int. Cl.$^7$ .............................................. H01L 21/336
(52) U.S. Cl. ..................................... 438/270; 438/268
(58) Field of Search ................................ 438/268, 270, 438/272

(56) References Cited

U.S. PATENT DOCUMENTS

| | | | |
|---|---|---|---|
| 5,072,266 A | 12/1991 | Bulucea et al. | 257/330 |
| 5,304,831 A | 4/1994 | Yilmaz et al. | 424/484 |
| 5,316,959 A | 5/1994 | Kwan et al. | 438/270 |
| 5,430,324 A | 7/1995 | Bencuya | 257/495 |
| 5,541,425 A | 7/1996 | Nishihara | 257/139 |
| 5,610,422 A * | 3/1997 | Yanagiya et al. | 257/330 |
| 5,639,676 A | 6/1997 | Hshieh et al. | 438/270 |
| 5,937,309 A | 8/1999 | Chuang | 438/424 |
| 5,998,833 A | 12/1999 | Baliga | 257/329 |
| 6,107,134 A | 8/2000 | Lu et al. | 438/239 |
| 6,265,748 B1 | 7/2001 | Hofmann et al. | 257/390 |
| 6,319,759 B1 | 11/2001 | Furukawa et al. | 438/151 |

FOREIGN PATENT DOCUMENTS

| | | | |
|---|---|---|---|
| JP | 63-166230 | 7/1988 | H01L/21/302 |
| JP | 64-57623 | 3/1989 | H01L/21/302 |
| JP | 10-98188 A | 4/1998 | H01L/29/78 |
| WO | WO 01/09956 A1 | 2/2001 | H01L/29/423 |

* cited by examiner

*Primary Examiner*—Vu A. Le
*Assistant Examiner*—Beth E. Owens
(74) *Attorney, Agent, or Firm*—Mayer Fortkort & Williams, PC; Stuart H. Mayer, Esq.; Karin L. Williams, Esq.

(57) ABSTRACT

A method for making trench DMOS is provided that improves the breakdown voltage of the oxide layer in a device having at least a first trench disposed in the active region of the device and a second trench disposed in the termination region of the device. In accordance with the method, mask techniques are used to thicken the oxide layer in the vicinity of the top corner of the second trench, thereby compensating for the thinning of this region (and the accompanying reduction in breakdown voltage) that occurs due to the two-dimensional oxidation during the manufacturing process.

14 Claims, 12 Drawing Sheets

SEMICONDUCTOR TRENCH DEVICE WITH ENHANCED GATE OXIDE INTEGRITY STRUCTURE

CROSS-REFERENCE TO RELATED APPLICATION

This application is a division of co-pending U.S. patent application Ser. No. 09/595,120, filed Jun. 16, 2000 entitled "Semiconductor Trench Device With Enhanced Gate Oxide Integrity Structure".

FIELD OF THE INVENTION

The present invention relates generally to MOSFET transistors and more generally to DMOS transistors having a trench structure.

BACKGROUND OF THE INVENTION

DMOS (Double diffused MOS) transistors are a type of MOSFET (Metal On Semiconductor Field Effect Transistor) that use diffusion to form the transistor regions. DMOS transistors are typically employed as power transistors to provide high voltage circuits for power integrated circuit applications. DMOS transistors provide higher current per unit area when low forward voltage drops are required.

A typical discrete DMOS circuit includes two or more individual DMOS transistor cells which are fabricated in parallel. The individual DMOS transistor cells share a common drain contact (the substrate), while their sources are all shorted together with metal and their gates are shorted together by polysilicon. Thus, even though the discrete DMOS circuit is constructed from a matrix of smaller transistors it behaves as if it were a single large transistor. For a discrete DMOS circuit it is desirable to maximize the conductivity per unit area when the transistor matrix is turned on by the gate.

One particular type of DMOS transistor is a so-called trench DMOS transistor in which the channel is formed vertically and the gate is formed in a trench extending between the source and drain. The trench, which is lined with a thin oxide layer and filled with polysilicon, allows less constricted current flow and thereby provides lower values of specific on-resistance. Examples of trench DMOS transistors are disclosed in U.S. Pat. Nos. 5,072,266 (Bulucea et al.), 5,541,425 (Nishihara), 5,430,324 (Bencuya), 5,639,676 (Hshieh et al.), 5,316,959 (Kwan et al.), 5,304,831 (Yilmaz et al.) and 5,866,931.

Figure 1A:
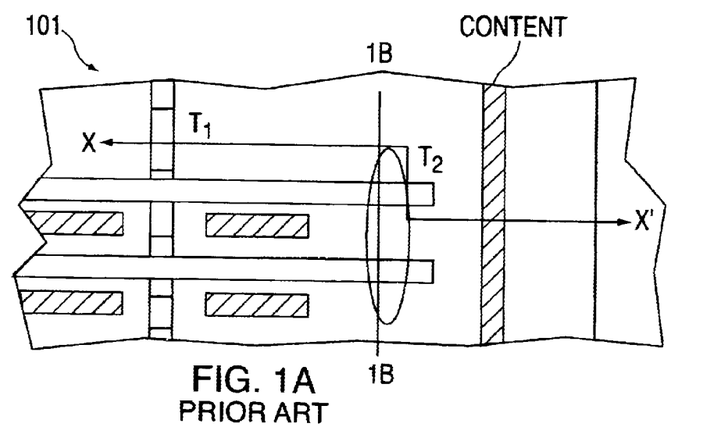
FIG. 1A is a plan view of a prior art DMOS device.
Figure 1B:
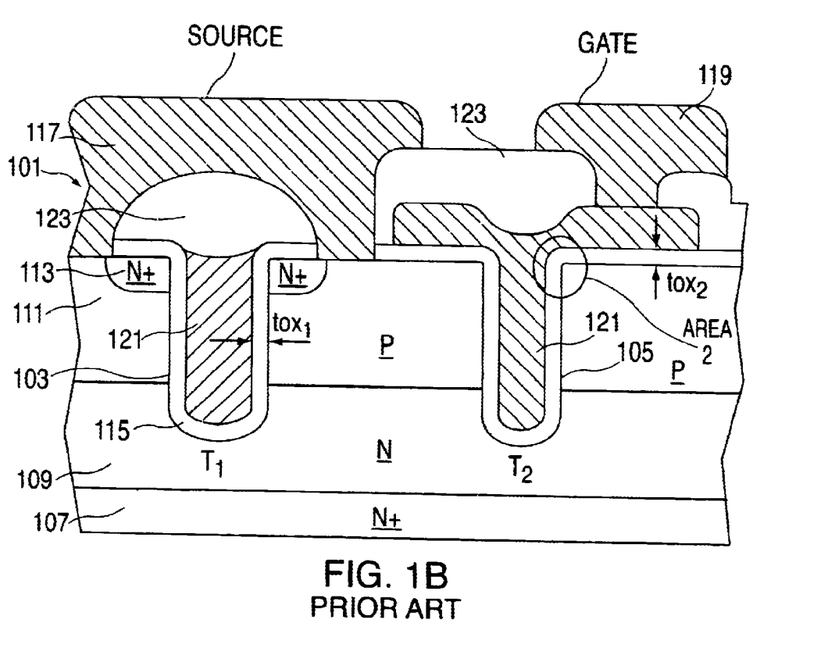
FIG. 1B is a cross-sectional view taken along the Line 1B—1B of FIG. 1.

FIGS. 1A and 1B depict one example of a conventional trench DMOS transistor 101. The device is provided with a first trench 103 $T_1$ which is in the active region of the transistor and a second trench 105 $T_2$ which is in the termination region of the transistor.

Referring now to FIG. 1B, which is a cross-sectional view of the device of FIG. 1A taken along the line X–X', the trenches reside in a substrate comprising an n+ doped layer 107, an n doped epitaxial layer 109, and a p type diffusion layer 111 of opposite conductivity. An n+ doped epitaxial layer 113 which overlies the p type diffusion layer serves as the source. The bottom of the trenches terminate in the n doped epitaxial layer. An insulating layer of silicon oxide 115 extends over the surface of both trenches. A source electrode 117 extends over the first trench, and a gate electrode 119 extends over the second trench. Both trenches are filled with polysilicon 121 and capped with BPSG 123 (boron phosphorosilicate glass).

Figure 1C:
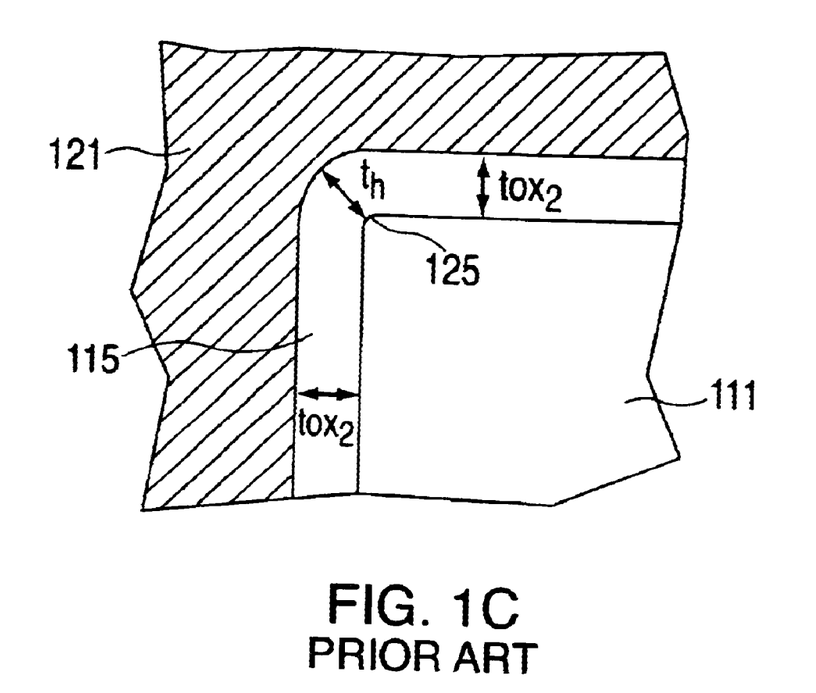
FIG. 1C is a magnified view of Area 2 in FIG. 2.

In the device depicted in FIG. 1B, the average thickness $t_{ox1}$ of the silicon oxide layer overlying the first trench is equal to the average thickness $t_{ox2}$ of the silicon oxide layer overlying the second trench, that is, $t_{ox1}=t_{ox2}$. Devices of this type have at least one drawback that is an artifact of the methodology by which the device is manufactured. In particular, the device is typically subjected to at least two oxidation treatments during its manufacture, the first of which is employed for the removal of damages occurring at the time of silicon etching after formation of the trenches, and the second of which is used to form the silicon oxide layer. As shown in FIG. 1C, these oxidation steps produce a defect 125 in the form of a protrusion of the p type diffusion layer 111 into the silicon oxide layer 115. This defect, often referred to as a "horn", occurs in the upper end corner of the sidewall of the trench. The horn terminates in an acute angle. The thickness "$t_h$" of the silicon oxide layer in the vicinity of the horn will be smaller than the average thickness $t_{ox2}$ of the silicon oxide layer positioned on the sidewall of the trench or on the surface of the p type diffusion layer.

During use, the n type polycrystalline silicon layer 121 that covers the horn and silicon oxide layer functions as a gate and is supplied with a predetermined potential. However, because of the shape of the horn, an electric field between the n type polycrystalline silicon layer and the substrate is concentrated in the vicinity of horn. Since the thickness of the silicon oxide layer in the vicinity of the horn is thin, the breakdown voltage of the silicon oxide layer is greatly reduced in this area.

Several approaches have been suggested in the art for dealing with this problem. One approach, which is disclosed in IEEE TRANSACTIONS ON ELECTRON DEVICES, VOL. ED-34, NO. 8, AUGUST, 1987, pp. 1681-P.1687, is directed toward the oxidation conditions of silicon. In this approach, oxidation is conducted at temperatures as high as 1100° C. According to the reference, a horn is not produced at these temperatures, and the upper end corner portion on the sidewall of the trench is rounded. Rounding the upper end corner portion on the sidewall of the trench relaxes the concentration of electric field at the portion, and the breakdown voltage of the silicon oxide layer positioned on the upper end corner portion of the sidewall of the trench is purportedly improved. However, this method is disadvantageous in that the use of such high temperatures in the oxidation steps can adversely affect on the structure of the impurity diffusion layers previously formed.

Another approach for avoiding the reduction in breakdown voltage of the silicon oxide layer at the upper corner portion of the sidewall of the trench is disclosed in laid open Japanese Patent Application Nos. 64-57623 and 63-166230. These references disclose a method of rounding the upper end corner portion on the sidewall of the trench by means of chemical dry etching. However, rounding the upper end corner portion on the sidewall trench in this manner is undesirable because, in order to relax the electric field intensity, the radius of curvature "r" of the corner portion must be increased. This in turn places a lower limit on the size of the device, which is a serious drawback in that it is desirable to minimize the size of the DMOS transistor.

U.S. Pat. No. 5,541,425 (Nishihara) discloses yet another approach which is intended to overcome the problems associated with segments of the gate oxide layer that have been thinned by two-dimensional oxidation. There, a method is disclosed whereby the top corner of the trench is rounded with an additional heavy arsenic implant through the use of an additional mask. However, the methodologies proposed therein are not suitable for a power MOSFET because the floating arsenic portion causes early avalanche breakdown. Moreover, the heavy doped arsenic portion induces silicon defects during subsequent oxidation processes such as sacrificial oxidation and gate oxidation.

U.S. Pat. No. 5,639,676 (Hshieh et al.) discloses a method for making a trenched DMOS transistor using seven masking steps. In accordance with the method, a masking step is used to produce an insulating oxide layer in the termination region which is thicker than the gate oxide layer in the active region of the transistor. However, as with the device depicted in FIGS. 1A–C, devices of this type are prone to reduction in breakdown voltage of the silicon oxide layer at the upper corner portion of the sidewall of the trench due to two-dimensional oxidation of the silicon oxide layer in this area.

There thus remains a need in the art for a trench DMOS device with improved gate oxide integrity and, in particular, a trench DMOS device having a gate oxide layer with improved breakdown voltage. There is also a need in the art for a method for making such a trench DMOS device, which method is applicable to power MOSFET devices. These and other needs are met by the present invention, as hereinafter disclosed.

SUMMARY OF THE INVENTION

The present invention relates to methods for creating trench DMOS devices with enhanced gate oxide integrity and, in particular, to trench DMOS devices in which the gate oxide layer has improved breakdown voltage, and to the trench DMOS devices so made.

In one aspect, the present invention relates to trench DMOS devices, and to methods for making the same. The trench DMOS devices comprise a first region (e.g., an n doped epitaxial layer) having a first conductivity type and a second region (e.g., a p type diffusion layer) having a second conductivity type, and have at least first and second trenches which are in communication with the first and second regions. A first electrically insulating layer is disposed over the surface of the first trench and has a mean thickness over the first trench of $t_1$. A second electrically insulating layer is disposed over the surface of the second trench and has a mean thickness over the second trench of $t_2$. The electrically insulating layers typically comprise an oxide such as silicon oxide. The ratio $t_1/t_2$ is greater than 1, and is typically at least about 1.2.

The trench DMOS devices made in accordance with this aspect of the invention are particularly useful in power MOSFET applications. In such an application, the first trench may be disposed in the termination region of the transistor and the second trench may be disposed in the active region of the transistor. The presence of the thicker insulating layer in the termination region maintains the breakdown voltage of the insulating layer at an acceptable level, particularly in the vicinity of the upper corner of the trench where two-dimensional oxidation is most likely to produce horns or similar defects in the insulating layer. Moreover, the thicker insulating layer improves the electric field distribution so that avalanche breakdown occurs in the active region of the transistor rather than in the termination region, thus causing breakdown voltage behavior to be more stable and predictable. The thicker insulating layer also improves process control and reduces substrate contamination during processing. The thicker the oxide, the less the dopant can penetrate from the doped polysilicon through the oxide into the substrate region so a thicker oxide can help to reduce the substrate contamination.

In some embodiments of the trench DMOS devices of the present invention, the average thickness of the insulating layer at the bottom of the second trench is also increased, without increasing the average thickness of the insulating layer in the upper portion of these trenches. Trench DMOS devices of these later embodiments have all of the advantages noted above. Moreover, the presence of a thicker insulating layer at the bottom of the trenches in the active region of a power MOSFET reduces penetration of dopant material through the insulating layer and into the p type diffusion layer in this area of the trench, thereby reducing punch-through.

In another aspect, the present invention relates to a method for making trench DMOS devices, and to the devices so made. In accordance with the method, an article is provided which comprises a first region having a first conductivity type and a second region having a second conductivity type. The article has first and second trenches which are in communication with the first and second regions. A first electrically insulating layer is then deposited over the surface of the first trench. The first insulating layer has a mean thickness over the first trench of $t_1$. Next, a second insulating layer is deposited over the surface of the second trench. The second insulating layer has a mean thickness over the second trench of $t_2$. The thicknesses of the two insulating layers are such that, if k is the larger of the two layers and m is the smaller of the two layers, then k/m is greater than 1, and typically is at least about 1.2.

In the various embodiments of the method of the present invention, the differences in thickness of the insulating layer may be achieved by depositing a first insulating layer over the first and second trench, and then depositing at least one mask (e.g., an oxide mask if the insulating layer is an oxide such as silicon oxide) over at least a portion of the first insulating layer, thereby defining a masked region and an unmasked region. In some embodiments of the method of the present invention, the masked region extends over the entire surface of the first trench, and the unmasked region extends over the entire surface of the second trench. In other embodiments, the masked region extends over the entire surface of the first trench and over a first portion of the surface of the second trench (e.g., the bottom), and the unmasked region extends over a second portion of the surface of the second trench. Any portion of the first insulating layer extending into the unmasked region is then removed, as by etching, and a second insulating layer having an average thickness $t_2$, wherein $t_1 \neq t_2$, is deposited over the unmasked region. Typically, if the first trench is located in the termination region of the transistor and the second trench is located in the active region of the transistor, then $t_1 > t_2$ This method may be used advantageously to produce a trench DMOS device of the type described above.

In yet another aspect, the present invention relates to an intermediary article which is useful in the construction of a trench DMOS transistors and similar devices, and to methods for making the same. The article comprises a first region having a first conductivity type and a second region having a second conductivity type. A first trench, which is in communication with the first and second regions, has first and second walls and terminates in a first bottom. The first wall extends from the first bottom to a surface of the article, and the intersection of the first wall and the surface defines a first locus. A second trench, which has third and fourth walls and terminates in a second bottom (the second bottom defines a second locus), also extends through the first and second regions. An electrically insulating material (typically an insulating oxide such as silicon oxide) is disposed over at least the first locus. In some embodiments, the insulating material extends over the second locus as well. The article is further provided with at least one mask which defines a masked region and an unmasked region. The masked region extends over the first locus and, in some embodiments, extends over the second locus as well. The unmasked region extends over all areas outside of the masked region, and typically includes at least a portion of the third and fourth walls of the second trench.

The intermediary articles of the present invention may be used advantageously in the manufacture of the trench DMOS transistors and devices of the present invention, as by removing any insulating material present in the unmasked region (as, for example, by chemical etching, where the insulating material is silicon oxide and the at least one mask is an oxide mask) and then depositing another portion of the same or different insulating material over the unmasked region (either before or after removal of the at least one mask). In this way, the thickness of the insulating material (which may form the gate oxide layer and/or a sacrificial oxide layer) may be varied independently over the masked and unmasked regions of the trench DMOS device so as to obtain the benefits described above.

DETAILED DESCRIPTION

The present invention pertains to trench DMOS devices (and to methods for making the same) with improved gate oxide integrity and, in particular, to trench DMOS devices having a gate oxide layer with improved breakdown voltage. These devices, and the methodology for making them, are particularly useful in making power MOSFET devices.

Figure 2:
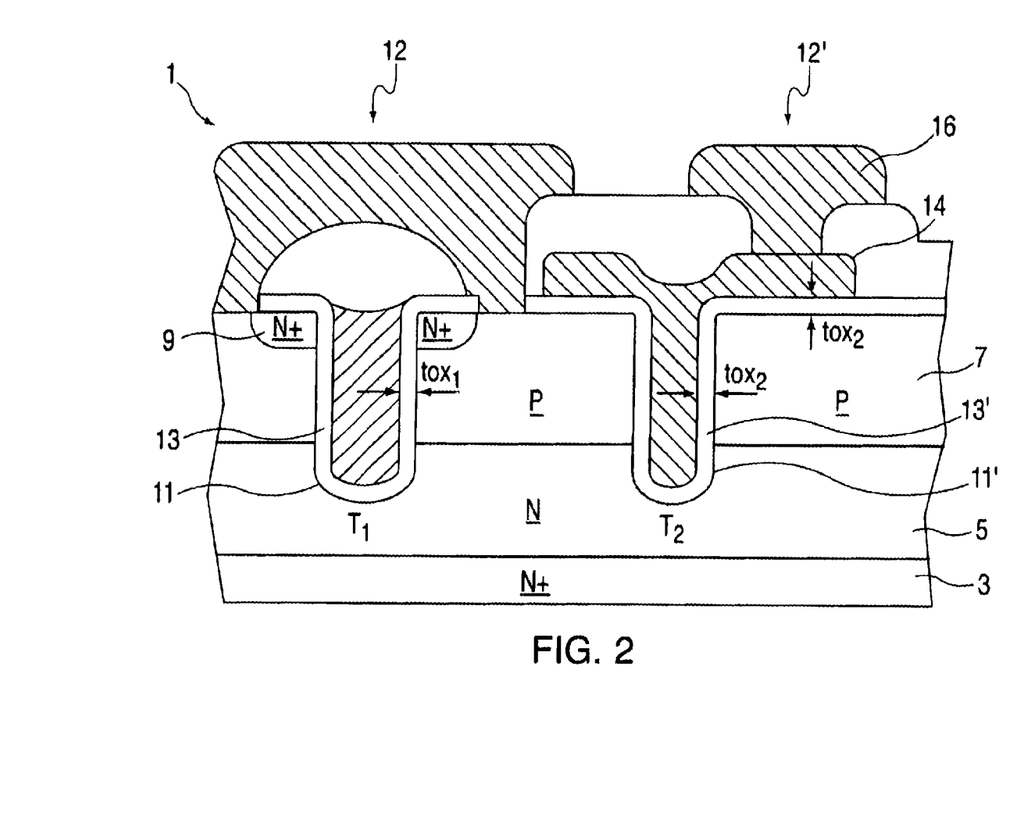
FIGS. 2–5 are a schematic cross-sectional views of trench DMOS transistor constructed in accordance with the present invention.

FIG. 2 illustrates a first embodiment of a trench DMOS device 1 which is made in accordance with the present invention. The structure includes an n+ substrate 3 on which is grown a lightly n doped epitaxial layer 5. Within the doped epitaxial layer, a p type diffusion layer 7 of opposite conductivity is provided. An N+ doped epitaxial layer 9 that overlies at least a portion of the p type diffusion layer serves as the source.

First and second trenches 11, 11' are provided in the epitaxial layer. The first trench is disposed in the active region 12 of the device and the second trench is disposed in the termination region 12' of the device. The second trench is filled with a portion of polysilicon 14 which extends to the top surface for contact with the gate 16. First and second oxide layers 13, 13' are provided in first and second trenches, respectively, the first and second oxide layers having respective thicknesses of $t_1$ and $t_2$ such that $t_2 > t_1$.

The thicknesses $t_1$ and $t_2$ are chosen such that the breakdown voltage of the oxide layers are sufficient for the intended end use, subject to the requirement that $t_2 > t_1$. The presence of the thicker oxide layer in the termination region maintains the breakdown voltage of the oxide layer at an acceptable level in the vicinity of the upper corner of the trench, where two-dimensional oxidation is most likely to produce horns or similar defects. Moreover, the thicker oxide layer improves the electric field distribution so that avalanche breakdown occurs in the active region of the transistor rather than in the termination region, thus causing breakdown voltage behavior to be more stable and predictable. The thicker silicon oxide layer also improves process control and reduces substrate contamination during processing.

Typically, $t_1$ and $t_2$ will be chosen such that the ratio $t_2 : t_1$ is at least about 1.2, more preferably at least about 1.5, and most preferably at least about 2. Typically, (for 30V device) $t_1$ is within the range of 400 to 700 angstroms, more preferably within the range of 500 to 650 angstroms, and most preferably within the range of 550 to 600 angstroms, while $t_2$ is typically within the range of 600 to 840 angstroms, more preferably within the range of 750 to 1050 angstroms, and most preferably within the range of 1000 to 1400 angstroms. In general, the gate oxide thickness (i.e., the oxide in the trench located in the active area) depends on the voltage of the device being fabricated.

Figure 3:
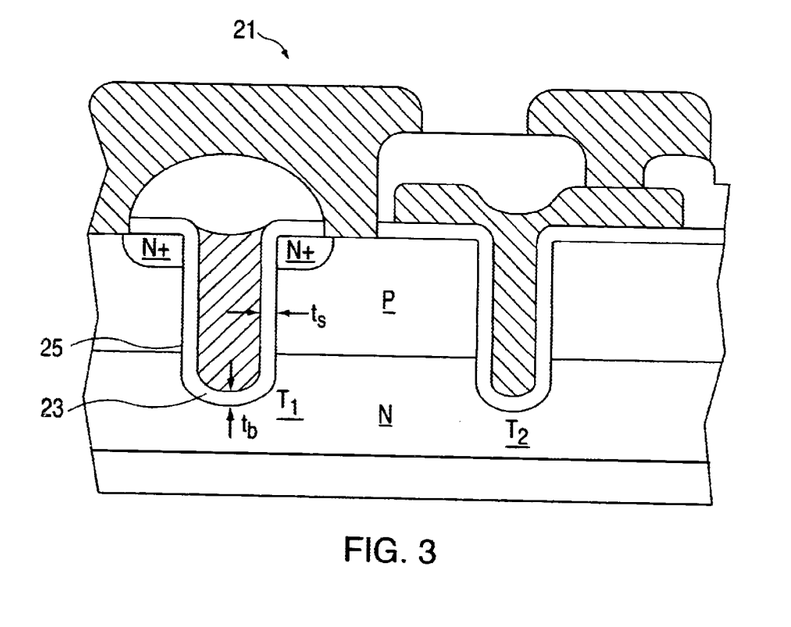

FIG. 3 illustrates a second embodiment of a trench DMOS structure 21 which is made in accordance with the present invention. This structure is similar to that depicted in FIG. 2, except that masking techniques are used to thicken the portion of the gate oxide layer 23 along the bottom of the first trench 25 as compared to the device of FIG. 2. This thickening of the gate oxide layer is advantageous in that it reduces penetration of dopant material through the insulating layer and into the p type diffusion layer in this area of the trench, thereby reducing punch-through. At the same time, however, the gate oxide layer is thinner elsewhere in the trench, thereby ensuring that avalanche breakdown occurs in the active region of the transistor rather than in the termination region. This in turn causes the breakdown voltage behavior of the device to be more stable and predictable. Typical values for the thickness $t_b$ of the oxide layer at the bottom of the first trench, and the thickness $t_s$ of the oxide layer along the sides of the trench, are comparable to the values of $t_1$ and $t_2$, respectively, for the device depicted in FIG. 2.

Figure 4:
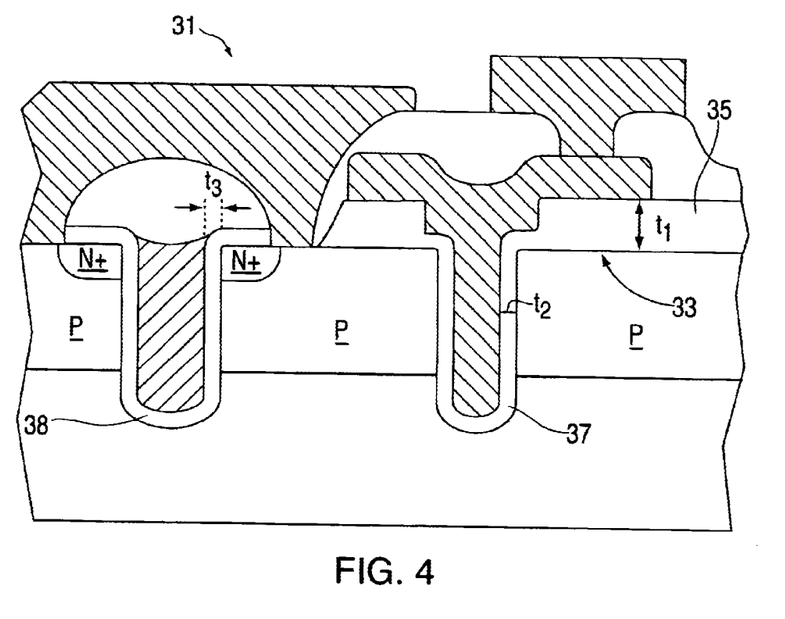

FIG. 4 illustrates a third embodiment of a trench DMOS structure 31 which is made in accordance with the present invention. This device is similar to the device depicted in FIG. 3, except that additional masking steps are used to produce an insulating oxide layer 33 in the termination region of the device which has a first region 35 with a thickness $t_1$ and a second region 37 with a thickness $t_2$. The gate oxide layer 38 in the active region of the device has a thickness $t_3$. The thicknesses of these layers are chosen such that $t_1 > t_2 > t_3$.

Typically, in this embodiment, $t_1$ and $t_2$ will be chosen such that the ratio $t_1 : t_2$ is at least about 1.5, more preferably at least about 3.0, and most preferably at least about 4.0. Typically, $t_1$ is within the range of 1500 to 2000 angstroms, more preferably within the range of 2000 to 2500 angstroms, and most preferably within the range of 3500 to 4500 angstroms, while $t_2$ is typically within the range of 600 to 840 angstroms, more preferably within the range of 750 to 1050 angstroms, and most preferably within the range of 1000 to 1400 angstroms. Typical values for $t_3$ correspond to the values for $t_2$ in the device of FIG. 2. The additional thickness of the first region in this embodiment is advantageous in that it reduces the gate runner capacitance.

Figure 5:
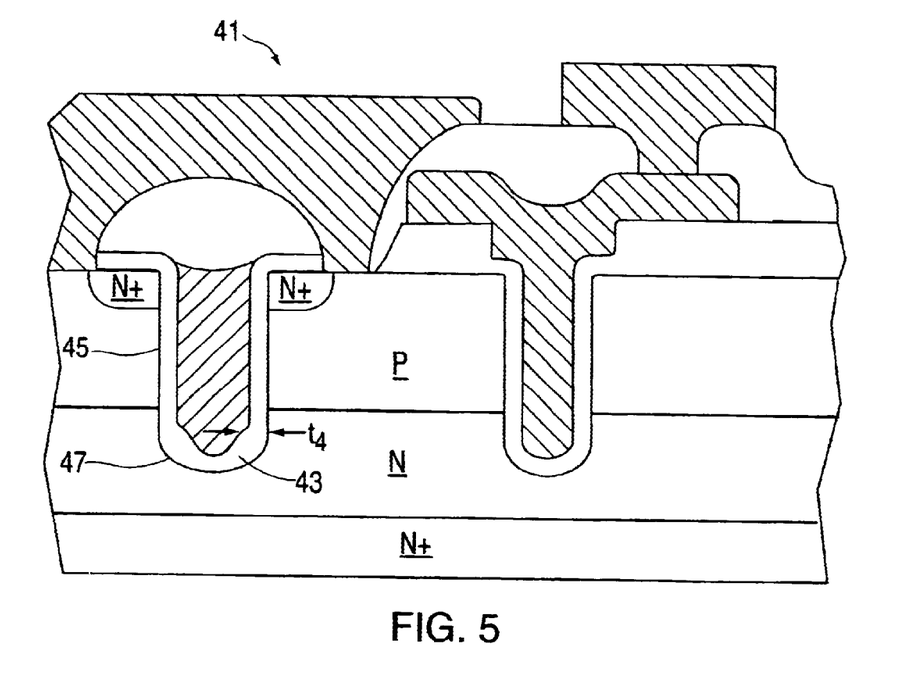

FIG. 5 illustrates a fourth embodiment of a trench DMOS structure 41 which is made in accordance with the present invention. This device is similar to the device depicted in FIG. 4 except that masking techniques are used to thicken the portion 43 of the gate oxide layer 45 along the bottom of the trench 47 in the active region of the device. The benefits of a thicker oxide layer in this region have been noted with respect to the embodiment depicted in FIG. 3. Portion 43 of the gate oxide layer will typically have a thickness $t_4$ comparable to the values of $t_2$ in the device depicted in FIG. 4.

Figure 6A:
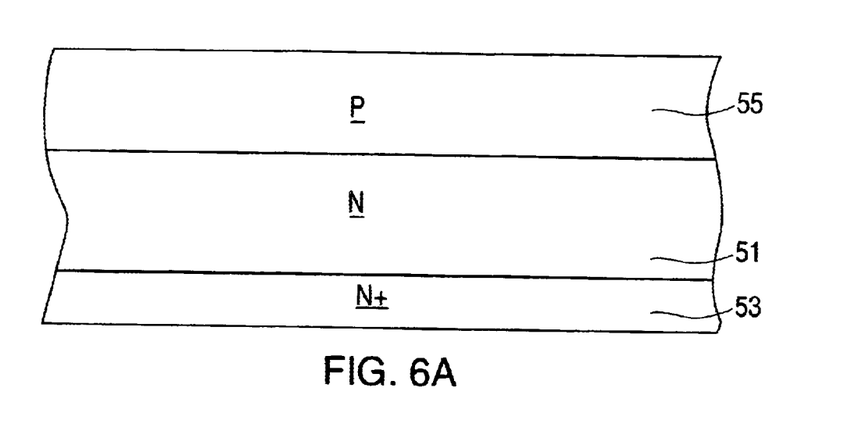
FIGS. 6A–6E are schematic cross-sectional views illustrating a method of making trench DMOS transistors in accordance with the present invention.

FIGS. 6A–6E illustrate a first embodiment of the method of the present invention that may be used to form a trench DMOS device of the type depicted in FIG. 2. In FIG. 6A, an n doped epitaxial layer 51 is grown on a conventionally n+ doped substrate 53. The epitaxial layer is typically 5.5 microns in thickness for a 30 V device. Next, p type diffusion layer 55 is formed in an implantation and diffusion step. Since the p type diffusion layer is uniform across the substrate, no mask is needed. The p type diffusion layer may be boron implanted at 40 to 60 KEV with a dosage of $5.5 \times 10^{13}/cm^3$.

Figure 6B:
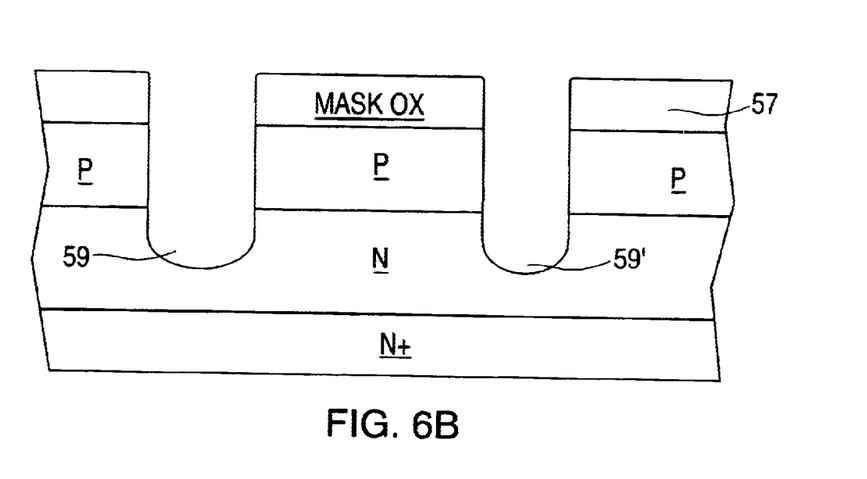

In FIG. 6B, a mask oxide layer is formed by covering the surface of the epitaxial layer with an oxide layer, which is then conventionally exposed and patterned to leave mask portions 57. Mask portions 57 are used for defining the location of the first and second trenches 59, 59' which are dry etched through the mask openings by reactive ion etching to a depth that typically ranges from 1.5 to 2.5 microns.

Figure 6C:
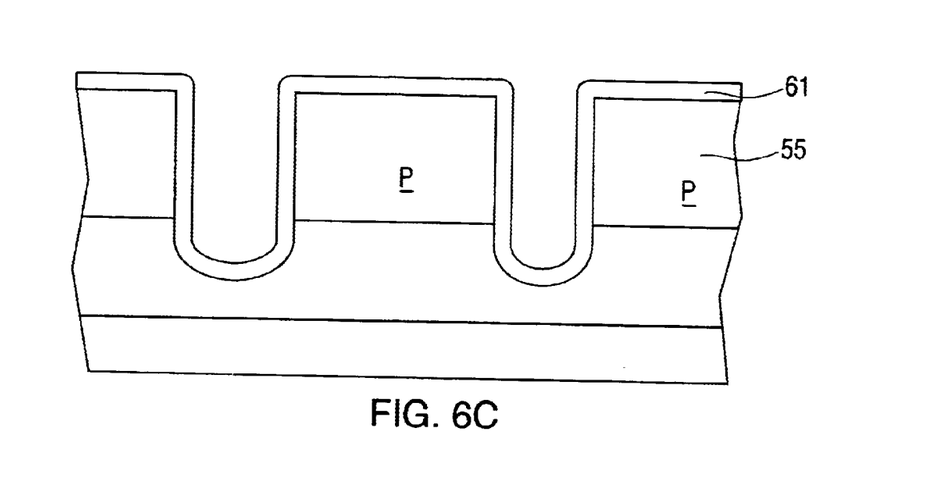

In FIG. 6C, the mask portions are removed, typically by a buffer oxide etch or an HF etch. Since the steps of trench formation are completed prior to removal of the patterned trench mask, and since the patterned trench mask serves as a cap or buffer during the trench forming process, dopant material does not leach out of the p type diffusion layer, and punch-through is consequently reduced.

After removal of the mask portions, a sacrificial oxide layer 61 is deposited on the entire structure so that it covers the trench walls and the surface of p type diffusion layer 55. The sacrificial oxide layer typically has a thickness $t_2$ in the range of 800 angstroms, more preferably within the range of 1000 angstroms, and most preferably within the range of 1200 angstroms.

Figure 6D:
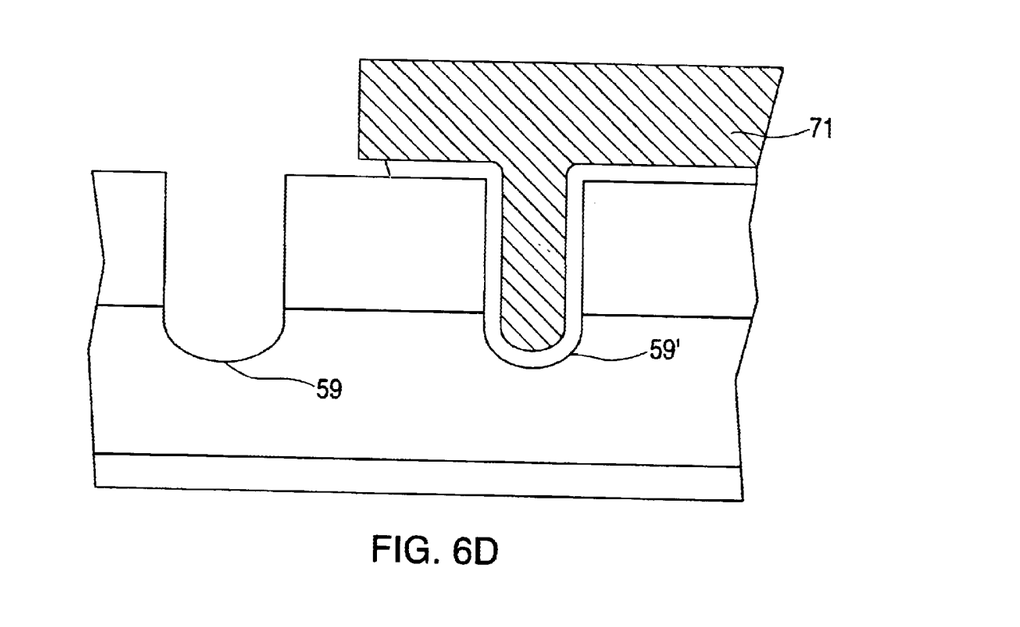

As shown in FIG. 6D, a sacrificial oxide mask 71 is deposited over the second trench 59', while the first trench 59 is left exposed. The sacrificial oxide layer is then removed from the surface of the first trench by means of an oxide etch.

Figure 6E:
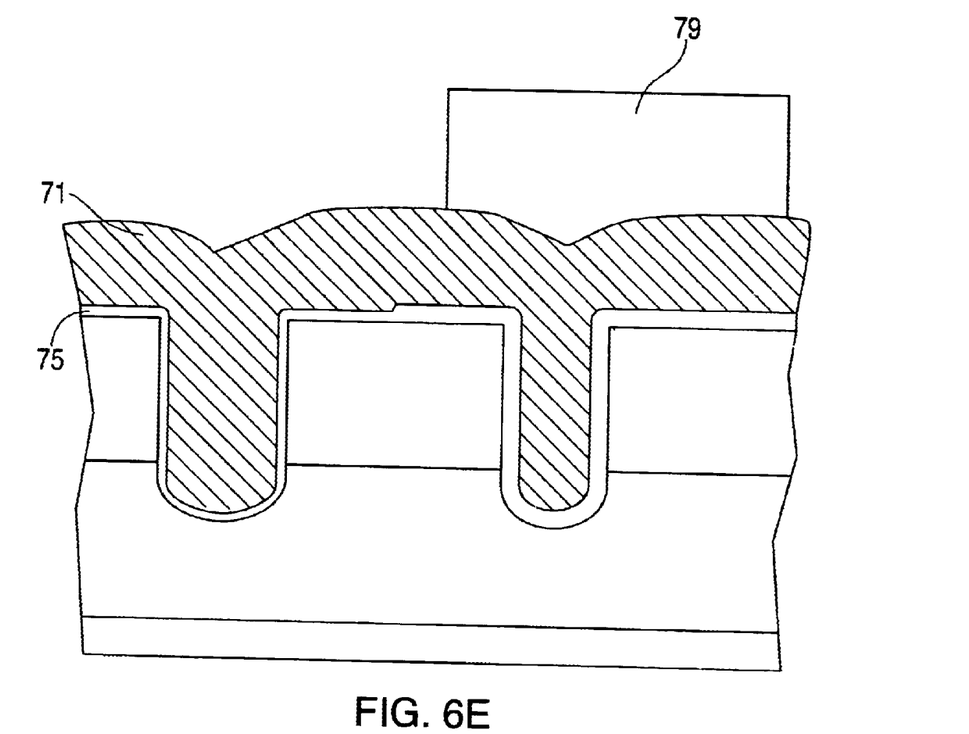

With reference to FIG. 6E, gate oxide layer 75 is then deposited on the surface of the first trench, followed by polysilicon 77 deposition. The polysilicon is then doped with phosphorous chloride or implanted with arsenic or phosphorous to reduce its resistivity, which resistivity is typically within the range of 20 ohm per square cm. A photoresist polysilicon mask 79 is then placed over the second trench, and the device is completed in a conventional manner to produce a device such as that depicted in FIG. 2.

Figure 7A:
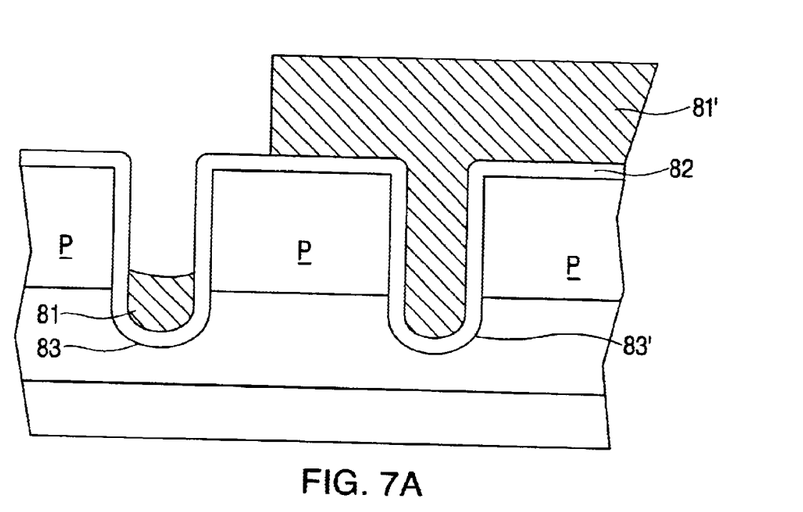
FIGS. 7A–7D are schematic cross-sectional views illustrating a method of making trench DMOS transistors in accordance with the present invention.
Figure 7B:
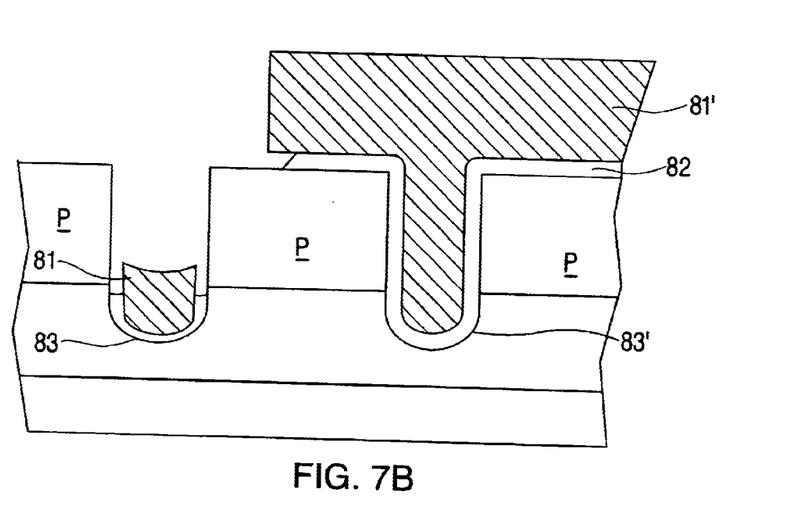
Figure 7C:
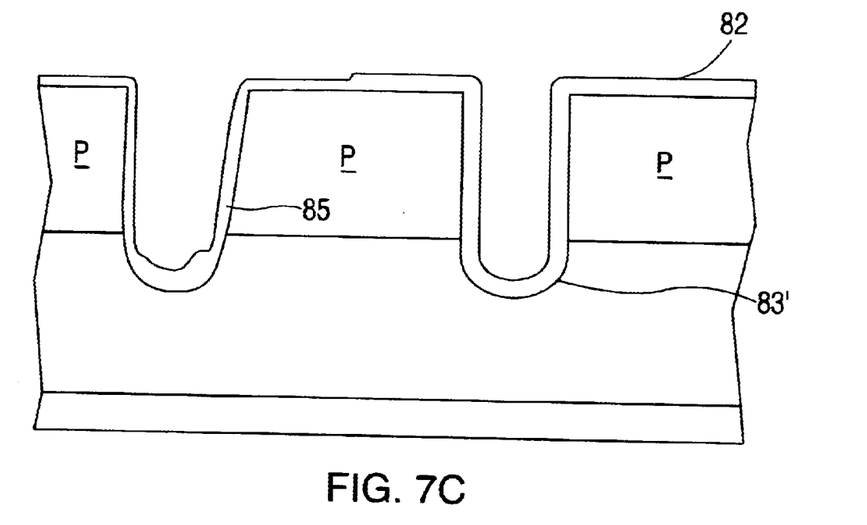
Figure 7D:
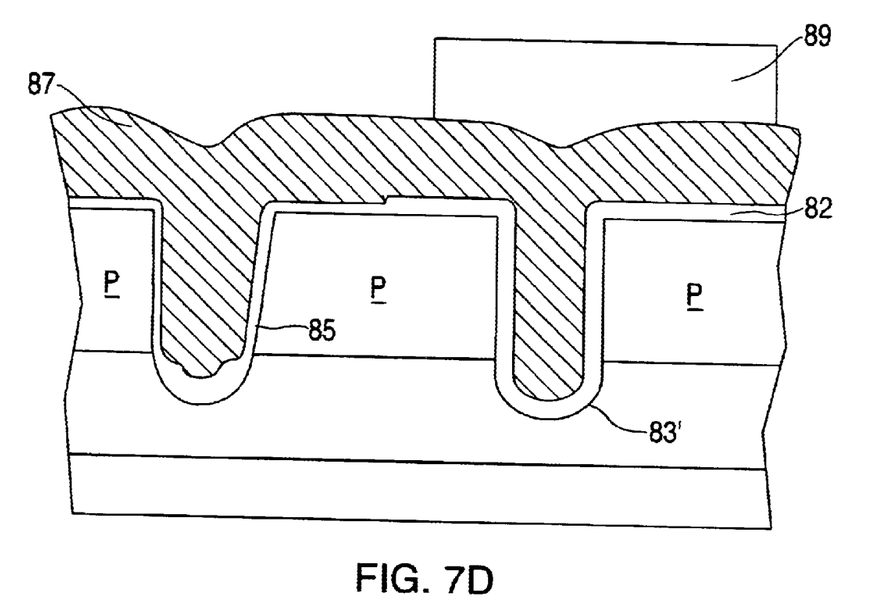

FIGS. 7A–7B show a second embodiment of the method of the present invention. As shown in FIG. 7A, in this embodiment first and second sacrificial oxide masks 81, 81' are deposited over the structure depicted in FIG. 6C such that the sacrificial oxide layer 82, which has an average thickness $t_1$, is completely covered in the vicinity of the second trench 83' but is covered only at the bottom of the first trench 83. The resulting structure is then exposed to an oxide etch which removes a portion of the sacrificial oxide layer in the vicinity of the first trench as shown in FIG. 7B. The sacrificial oxide masks are then removed and a gate oxide layer 85 having an average thickness $t_2$ is deposited to give the structure depicted in FIG. 7C. A layer of polysilicon 87 is then deposited over the gate oxide layer and sacrificial oxide layer, the polysilicon is doped, and a photoresist polysilicon mask 89 is placed over the second trench to give the structure depicted in FIG. 7D. The device is then completed in a conventional manner to result in a device such as that depicted in FIG. 3. Typical values for $t_1$ and $t_2$ are noted with respect to the device depicted in FIG. 3.

Figure 8A:
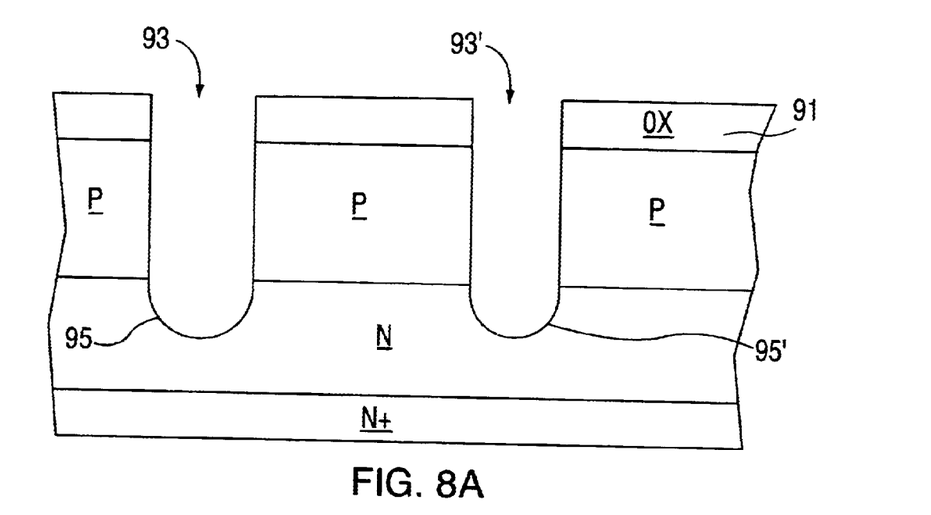
FIGS. 8A–8B are schematic cross-sectional views illustrating a method of making trench DMOS transistors in accordance with the present invention.
Figure 8B:
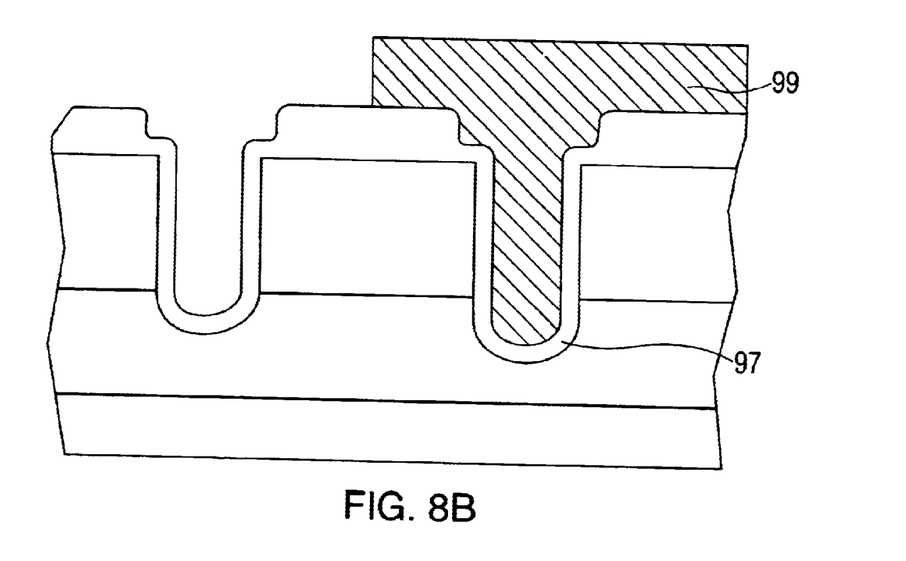

FIGS. 8A–8B show a third embodiment of the method of the present invention. As shown in FIG. 8A, in this embodiment a first oxide layer 91 having a thickness $t_1$ is deposited over a substrate of the type depicted in FIG. 6A. The first oxide layer is then patterned into a prescribed shape having at least first and second openings 93, 93', thereby forming an oxide mask. Corresponding first and second trenches 95, 95' are then anisotropically etched through the mask openings. A sacrificial oxide layer (not shown) is deposited over the etched structure to remove any damages that occurred during etching, after which the sacrificial oxide layer is removed.

Next, the trenches are subject to thermal oxidation to form a second oxide film 97 having a thickness $t_2$, wherein $t_1 > t_2$, over the surfaces of the trenches. Such a film may be formed, for example, in an oxygen/hydrogen atmosphere at about 950° C., with the time of deposition and other parameters being controlled to achieve a desired layer thickness. An oxide mask 99 is then deposited over the second trench. The device is then typically subjected to an oxide etch to form a structure analogous to that shown in FIG. 6D, and is completed using methodology similar to that described with respect to FIG. 6E to result in the device depicted in FIG. 4. If desired, additional masking steps (e.g., the placement of an oxide mask on the bottom of the first trench) may be performed prior to oxide etching so as to form a device such as that depicted in FIG. 5 in which the gate oxide layer is thickened in the vicinity of the bottom of the first trench.

Although various embodiments are specifically illustrated and described herein, it will be appreciated that modifications and variations of the present Invention are covered by the above teachings and are within the purview of the appended claims without departing from the spirit and intended scope of the invention. For example, the method of the present invention may be used to form a trench DMOS in which the conductivities of the various semiconductor regions are reversed from those described herein.

What is clamed is:

1. A method for making a trench DMOS, comprising the steps of:
   providing an semiconductor device comprising a first region having a first conductivity type and a second region having a second conductivity type, the article having first and second trenches which are in communication with the first and second regions;
   depositing a first electrically insulating layer over the surface of the first trench, the first insulating layer having a mean thickness over the first trench of $t_1$; and
   depositing a second electrically insulating layer over the surface of the second trench, said second insulating layer having a mean thickness over the second trench of $t_2$;
   wherein the ratio $t_1/t_2$ is at least about 1.2

2. The method of claim 1, wherein $t_1/t_2$ is at least about 1.5.

3. The method of claim 1, wherein $t_1/t_2$ is at least about 2.

4. The method of claim 1, wherein $t_1$ is within the range of about 600 to about 840 angstroms.

5. The method of claim 1, wherein $t_1$ is within the range of about 750 to about 1050 angstroms.

6. The method of claim 1, wherein $t_1$ is within the range of about 1000 to about 1400 angstroms.

7. The method of claim 1, wherein the first and second insulating layers are oxide layers.

8. The method of claim 7, wherein the first and second insulating layers comprise silicon oxide.

9. The method of claim 1, further comprising the step of depositing polycrystalline silicon into the first and second trenches.

10. The method of claim 1, wherein the first insulating layer has an essentially uniform thickness over the first trench.

11. The method of claim 1, wherein the first region comprises an n doped epitaxial layer, and wherein the second region is a p type diffusion layer.

12. The method of claim 11, wherein the semiconductor device further comprises an n+ doped epitaxial layer, wherein the p type diffusion layer is disposed on a first side of the n doped epitaxial layer, and wherein the n+ doped layer is disposed on a second side of the n doped epitaxial layer.

13. A trench DMOS device made in accordance with claim 1, said trench DMOS device comprising an active portion and a termination portion, and wherein the first trench is disposed in the termination portion and the second trench is disposed in the active portion.

14. A power MOSFET made in accordance with the method of claim 13.

* * * * *

UNITED STATES PATENT AND TRADEMARK OFFICE
CERTIFICATE OF CORRECTION

PATENT NO.    : 6,620,691 B2
DATED         : September 16, 2003
INVENTOR(S)   : Fwu-Iuan Hshieh et al.

It is certified that error appears in the above-identified patent and that said Letters Patent is hereby corrected as shown below:

Title page, Item [54] and Column 1, lines 1-3,
Title, change "SEMICONDUCTOR TRENCH DEVICE WITH ENHANCED GATE OXIDE INTEGRITY STRUCTURE" to -- METHOD OF MANUFACTURING A TRENCH DMOS STRUCTURE WITH DIFFERENT-THICKNESS GATE OXIDE LAYERS IN THE TRENCHES --.

Column 5,
Line 13, change "and the at least" to -- and at least --.

Column 8,
Line 53, change "providing an semiconductor" to -- providing a semiconductor --.

Column 9,
Line 15, change "trenches." to -- trenches after deposition of the first and second electrically insulating layers. --.

Signed and Sealed this

Twenty-eighth Day of December, 2004

JON W. DUDAS
*Director of the United States Patent and Trademark Office*